(12) United States Patent
Curtis

(10) Patent No.: US 10,048,299 B2
(45) Date of Patent: Aug. 14, 2018

(54) ELECTRIC POWER SENSOR

(71) Applicant: Intermountain Electronics, Inc., Price, UT (US)

(72) Inventor: Dale Curtis, Castle Dale, UT (US)

(73) Assignee: INTERMOUNTAIN ELECTRONICS, INC., Price, UT (US)

( * ) Notice: Subject to any disclaimer, the term of this patent is extended or adjusted under 35 U.S.C. 154(b) by 156 days.

(21) Appl. No.: 14/724,764

(22) Filed: May 28, 2015

(65) Prior Publication Data
US 2015/0346248 A1    Dec. 3, 2015

Related U.S. Application Data

(60) Provisional application No. 62/004,057, filed on May 28, 2014.

(51) Int. Cl.
*H01B 7/36* (2006.01)
*G01R 21/00* (2006.01)
(Continued)

(52) U.S. Cl.
CPC ............ *G01R 21/00* (2013.01); *H05K 1/111* (2013.01); *H05K 1/118* (2013.01); *H05K 1/162* (2013.01);
(Continued)

(58) Field of Classification Search
CPC .... H02G 15/184; H02G 15/1833; H01B 7/17; H01B 7/32; H01B 7/326; H01B 7/328; H01B 9/00; H01B 9/02; H01B 9/021; H01B 9/022; H01B 9/023; H01B 11/1016; G09F 3/04; G09F 3/10; G01R 19/155; G01R 19/0084
(Continued)

(56) References Cited

U.S. PATENT DOCUMENTS 4,783,359 A * 11/1988 Fleischer ................. H01P 9/00
174/255
4,890,623 A * 1/1990 Cook ..................... A61B 5/042
29/831
(Continued)

FOREIGN PATENT DOCUMENTS

EP    2608339 A1 *  6/2013  .......... H02G 15/184
WO   WO 2007066252 A1 *  6/2007  ............. H05B 35/00

OTHER PUBLICATIONS

WO 2007/066252 A1 provided with Office Action.*
(Continued)

*Primary Examiner* — Chau N Nguyen
*Assistant Examiner* — Roshn Varghese
(74) *Attorney, Agent, or Firm* — Kunzler, PC

(57) ABSTRACT

An electric power sensor includes a sensor pad and an electric terminal. The sensor pad includes a flexible substrate that defines a first surface and a second surface that opposes the first surface. Additionally, the sensor pad includes an electrically-conductive layer applied to the first surface of the flexible substrate. The sensor pad further includes an adhesive layer applied to the second surface of the flexible substrate. The electric terminal is coupled to the electrically-conductive layer of the sensor pad.

15 Claims, 7 Drawing Sheets

(51) Int. Cl.
   *H05K 1/11*      (2006.01)
   *H05K 1/16*      (2006.01)
   *H01G 4/06*      (2006.01)
   *H01G 4/40*      (2006.01)
(52) U.S. Cl.
   CPC .............. *H01G 4/06* (2013.01); *H01G 4/40* (2013.01); *Y02P 70/611* (2015.11)
(58) Field of Classification Search
   USPC ............ 174/74 A, 85, 88 C, 91, 112, 119 C, 174/119 R, 108
   See application file for complete search history.

(56) References Cited

U.S. PATENT DOCUMENTS

| | | | | |
|---|---|---|---|---|
| 5,051,733 A | * | 9/1991 | Neuhouser | G01R 19/155 174/73.1 |
| 5,065,142 A | * | 11/1991 | Green | G01R 19/155 174/73.1 |
| 8,263,201 B2 | * | 9/2012 | Caveney | G09F 3/0295 428/343 |
| 9,717,141 B1 | * | 7/2017 | Tegg | H05K 1/0268 |
| 2016/0139181 A1 | * | 5/2016 | Gravermann | G01R 19/0084 324/686 |

OTHER PUBLICATIONS

EP 2608339 A1 provided with Office Action.*
Installation of ZCT 15 and ZCT 25 Cable Sensors with "Zero Corona Technology", Line Power ZCT installation instructions, printed Mar. 7, 2011.†
Chirp-Alert: a High Voltage "Power On" Indicator, Service Machine Co. catalog, printed Jan. 6, 1998.†

\* cited by examiner
† cited by third party

ELECTRIC POWER SENSOR

CROSS-REFERENCE TO RELATED APPLICATION

This application claims the benefit of U.S. Provisional Patent Application No. 62/004,057, filed May 28, 2014, which is incorporated herein by reference.

FIELD

The present disclosure relates generally to electric power systems, and more particularly to sensing electric power in electric power systems.

BACKGROUND

High-voltage electric power is used to operate electrical devices for various applications. For example, in mining applications, high-voltage, three-phase electric power is used to power high-load electrical equipment. Typically, each phase of three-phase electric power is transmitted along separate power cables. Each power cable may include an electrically-conductive wire surrounded by an electrically-insulating sleeve.

Sensors are used to detect whether the electrically-conductive wires of the power cables are energized. Generally, multiple sensors, each associated with a respective one of the power cables, are coupled to the cables. The sensors may provide any of various alerts, such as audible and visual, to indicate the energy state of the cables.

SUMMARY

The subject matter of the present application has been developed in response to the present state of the art, and in particular, in response to the problems and needs in the high-voltage electrical power sensing art that have not yet been fully solved by currently available technologies. For example, although known high-voltage sensors may accomplish the intended function of detecting the energy state of high-voltage power cables and providing a corresponding alert, such high-voltage sensors have various shortcomings. For example, some conventional high-voltage sensors are prone to inducing dangerous and damaging corona because they do not form a proper fit (e.g., they create gaps) about the power cables, and may be difficult to retroactively install onto existing power cables. Other conventional high-voltage sensors, while potentially reducing corona and allowing for retroactive installation onto existing power cables, may be overly difficult and time-consuming to install. Accordingly, in certain embodiments, a high-voltage sensor is described herein that overcomes at least the above and other shortcomings of the prior art.

According to one embodiment, an electric power sensor includes a sensor pad and an electric terminal. The sensor pad includes a flexible substrate that defines a first surface and a second surface that opposes the first surface. Additionally, the sensor pad includes an electrically-conductive layer applied to the first surface of the flexible substrate. The sensor pad further includes an adhesive layer applied to the second surface of the flexible substrate. The electric terminal is coupled to the electrically-conductive layer of the sensor pad.

In some implementations of the electric power sensor, the electric terminal is soldered to the electrically-conductive layer. The sensor pad can form a hollow tube.

According to certain implementations of the electric power sensor, the flexible substrate includes a flexible printed circuit board. The flexible substrate can be made from a non-conductive material in some implementations. In yet some implementations, the flexible substrate is made from a polymer.

In certain implementations, the electric power sensor further includes indicia on one of the electrically-conductive layer and adhesive layer. The indicia indicate at least one of various lengths and various widths of the sensor pad. Each of the various lengths or widths is associated with one of a plurality of voltages, cable sizes, or both voltages and cable sizes. The indicia indicate at least one of a length or width of the sensor pad in some implementations. The length indicated by the indicia is associated with a size of a power cable. The width indicated by the indicia is associated with a range of voltages to be monitored with the electric power sensor.

According to some implementations, the electric power sensor includes a relaxation oscillator that is electrically coupled to the electric terminal. The relaxation oscillator includes a capacitor in parallel with a gas discharge lamp. The relaxation oscillator further includes at least one light-emitting device in series with the gas discharge lamp. The at least one light-emitting device may consist of only the gas discharge lamp itself, or the gas discharge lamp plus other light-emitting devices in series with the lamp.

In some implementations of the electric power sensor, the electric terminal is non-removably coupled to the electrically-conductive layer. The electrically-conductive layer can be non-removably fixed to the first surface of the flexible substrate, and the adhesive layer can be non-removably fixed to the second surface of the flexible substrate. According to certain implementations, the electrically-conductive layer acts is a ground plane covering substantially the entire flexible substrate.

According to another embodiment, an electric power system includes an electric power sensor and a power cable. The electric power sensor includes a sensor pad and an electric terminal. The sensor pad includes a flexible substrate that defines a first surface and a second surface opposing the first surface, an electrically-conductive layer that is applied to the first surface of the flexible substrate, and an adhesive layer that is applied to the second surface of the flexible substrate. The electric terminal is coupled to the electrically-conductive layer of the sensor pad. The power cable includes an electrically-conductive wire surrounded by an electrically-insulating sleeve. The sensor pad is wrapped about the power cable, and the adhesive layer is adhered to the electrically-insulating sleeve.

In some implementations, the electric power system further includes a capacitor. The electrically-conductive wire forms a first plate of the capacitor, the electrically-conductive layer forms a second plate of the capacitor, and the electrically-insulating sleeve forms at least part of a dielectric of the capacitor. The electric power system can also include electrically non-conductive tape wrapped about the sensor pad and power cable.

In yet another embodiment, a method of sensing electric energy in a power cable includes wrapping an electric sensor pad about the power cable. The electric sensor pad includes a flexible substrate, and electrically-conductive layer coupled to the flexible substrate, and an adhesive layer coupled to the flexible substrate. The method further includes adhering the adhesive layer to the power cable. Also, the method includes wrapping insulation about the electric sensor pad and the power cable.

According to some implementations, the method further includes permanently coupling an electric terminal to the electrically-conductive layer prior to wrapping the electric sensor pad about the power cable.

In certain implementations, the method also includes cutting a width of the electric sensor pad along indicia on the sensor pad according to a voltage rating of the power cable, a size of the power cable, or both a voltage rating and size of the power cable prior to wrapping the electric sensor pad about the power cable.

The described features, structures, advantages, and/or characteristics of the subject matter of the present disclosure may be combined in any suitable manner in one or more embodiments and/or implementations. In the above description, numerous specific details are provided to impart a thorough understanding of embodiments of the subject matter of the present disclosure. One skilled in the relevant art will recognize that the subject matter of the present disclosure may be practiced without one or more of the specific features, details, components, materials, and/or methods of a particular embodiment or implementation. In other instances, additional features and advantages may be recognized in certain embodiments and/or implementations that may not be present in all embodiments or implementations. Further, in some instances, well-known structures, materials, or operations are not shown or described in detail to avoid obscuring aspects of the subject matter of the present disclosure. The features and advantages of the subject matter of the present disclosure will become more fully apparent from the above description and appended claims, or may be learned by the practice of the subject matter as set forth hereafter.

BRIEF DESCRIPTION OF THE DRAWINGS

In order that the advantages of the subject matter may be more readily understood, a more particular description of the subject matter briefly described above will be rendered by reference to specific embodiments that are illustrated in the appended drawings. Understanding that these drawings depict only typical embodiments of the subject matter and are not therefore to be considered to be limiting of its scope, the subject matter will be described and explained with additional specificity and detail through the use of the drawings, in which.

DETAILED DESCRIPTION

Reference throughout this specification to "one embodiment," "an embodiment," or similar language means that a particular feature, structure, or characteristic described in connection with the embodiment is included in at least one embodiment of the present disclosure. Appearances of the phrases "in one embodiment," "in an embodiment," and similar language throughout this specification may, but do not necessarily, all refer to the same embodiment. Similarly, the use of the term "implementation" means an implementation having a particular feature, structure, or characteristic described in connection with one or more embodiments of the present disclosure, however, absent an express correlation to indicate otherwise, an implementation may be associated with one or more embodiments.

Figure 1:
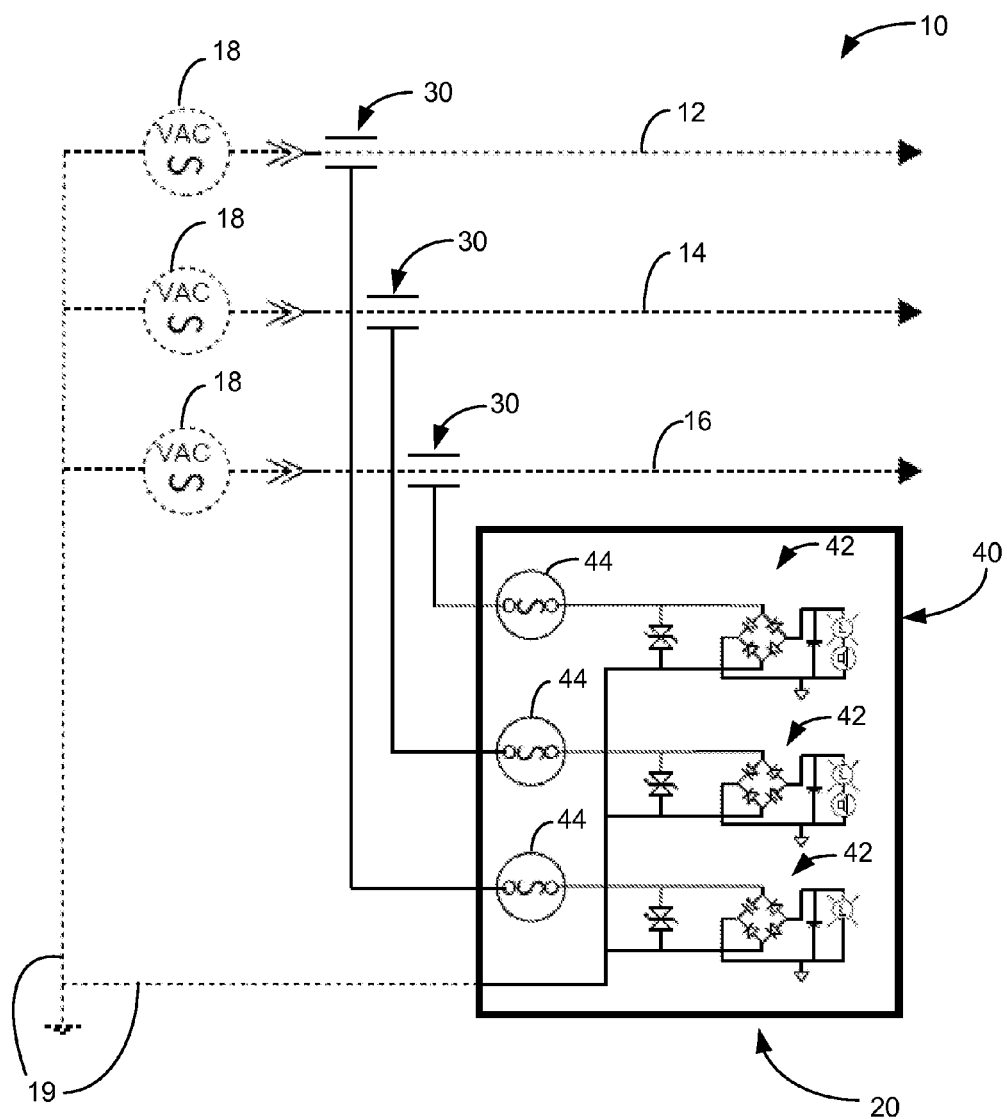
FIG. 1 is a schematic block diagram of an electric power system, according to one embodiment.

Referring to FIG. 1, according to one embodiment, a schematic block diagram of an electric power system 10 is shown. The electric power system 10 transmits high-voltage electric power to one or more electric power transmission or consumption devices via one or more power lines. In certain implementations, the electric power system 10 transmits three-phase alternating-current (AC) power. Accordingly, the electric power system 10 can include three separate power lines 12, 14, 16, one for each phase of the electric power being transmitted. The three-phase AC power can be supplied from an electric power source 18, which is grounded by a grounding conductor 19.

Figure 4:
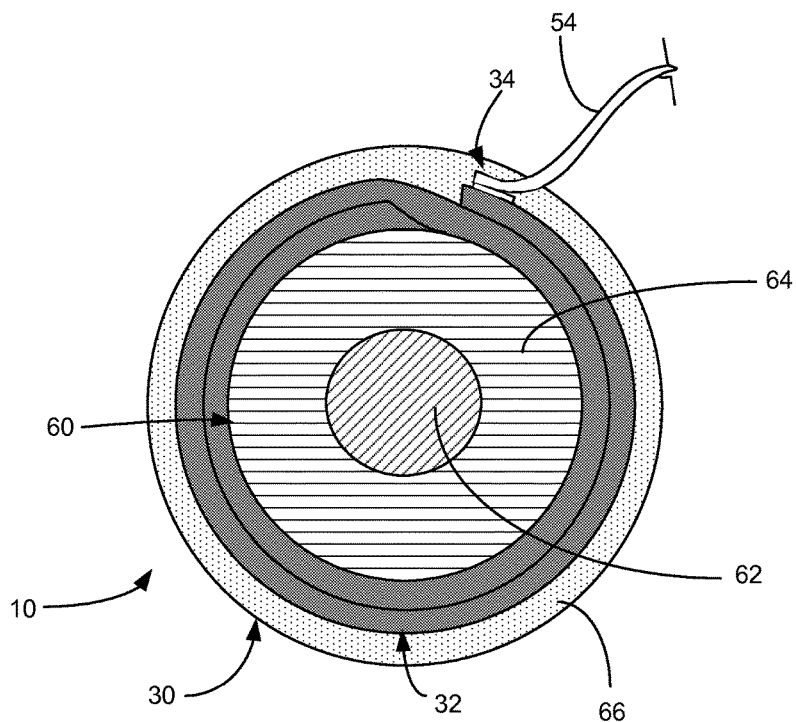
FIG. 4 is a partial cross-sectional front view of an electric power system with an electric power sensor, according to one embodiment.

Each of the power lines 12, 14, 16 can be a power cable with an electrically-conductive wire, surrounded by an electrically non-conductive or electrically-insulating sleeve. One particular implementation of a power cable 60 is shown in FIG. 4. The power cable 60 includes an electrically-conductive wire 62 surrounded by a non-conductive sleeve 64. The wire 62 can be made from an electrically-conductive material, such as copper, and the sleeve 64 can be made from an electrically non-conductive material, such as a polymer. The power cables of the power lines 12, 14, 16, as well as power cable 60, can have any of various sizes and be rated to transmit electric power at any of various voltages. In some implementations, the power cables of the present disclosure are configured to transmit high-voltage power, such as electric power having a voltage between about 1 kV and about 25 kV. However, in other implementations, the voltage of the electric power transmitted by the power lines 12, 14, 16 can be higher than 25 kV or lower than 1 kV.

The electric power system 10 also includes a plurality of electric power sensors 30 each coupled to a respective one of the power lines 12, 14, 16. Generally, the sensors 30 are coupled to an exterior of the power cables of the power lines 12, 14, 16, such that the non-conductive sleeve of each power cable is positioned between the sensor and the conductive wire of the power cable. Each sensor 30 includes an electrically-conductive layer, as will be explained in more detail below. The electrically-conductive layer of each sensor 30 and the conductive wire of the corresponding cable form the "plates" of a capacitor, and the electrically-insulating sleeve of the cable forms the dielectric of the capacitor. In this manner, each sensor 30 forms a capacitor with the cable to which it is coupled, such that the sensors can be considered capacitive sensors. Because the voltages on the conductive wires are AC, a small amount of electrical energy, in the form of AC current, from the conductive wires in the cables will pass through the capacitors formed by the sensors 30 and the cables, and will be transmitted to a monitor module 40 of the sensors 30 via separate electric power transmission lines. These AC currents will be roughly proportional to the levels of the respective AC voltages on the conductive wires.

The monitor module 40 processes any AC currents from the capacitors, determines whether electric energy is being transmitted through the power lines 12, 14, 16, and provides an indication of the energy state of the power lines. As shown in FIG. 1, the monitor module 40 includes multiple inputs for receiving electric energy from the electric power transmission lines, respectively. The electric energy from each input is introduced into one or multiple, identical sensing circuits 42, typically after passing through one of multiple fuses 44. Generally, each sensing circuit 42 is configured to function as a relaxation oscillator to provide a visual and/or auditory indication that a corresponding one of the power lines 12, 14, 16 is in an energized state (i.e., electric power is being transmitted through the power line) or a non-energized state (i.e., electric power is not being transmitted through the power line). Therefore, the monitor module 40 may include three separate visual and/or auditory alerts for each of the three power lines. However, in other embodiments, such as those with less or more than three power lines, the monitor module 40 may include fewer or more than three visual and/or auditory alerts. The monitor module 40 may be considered separate from or as forming part of one or more electric power sensors 30.

Figure 2:
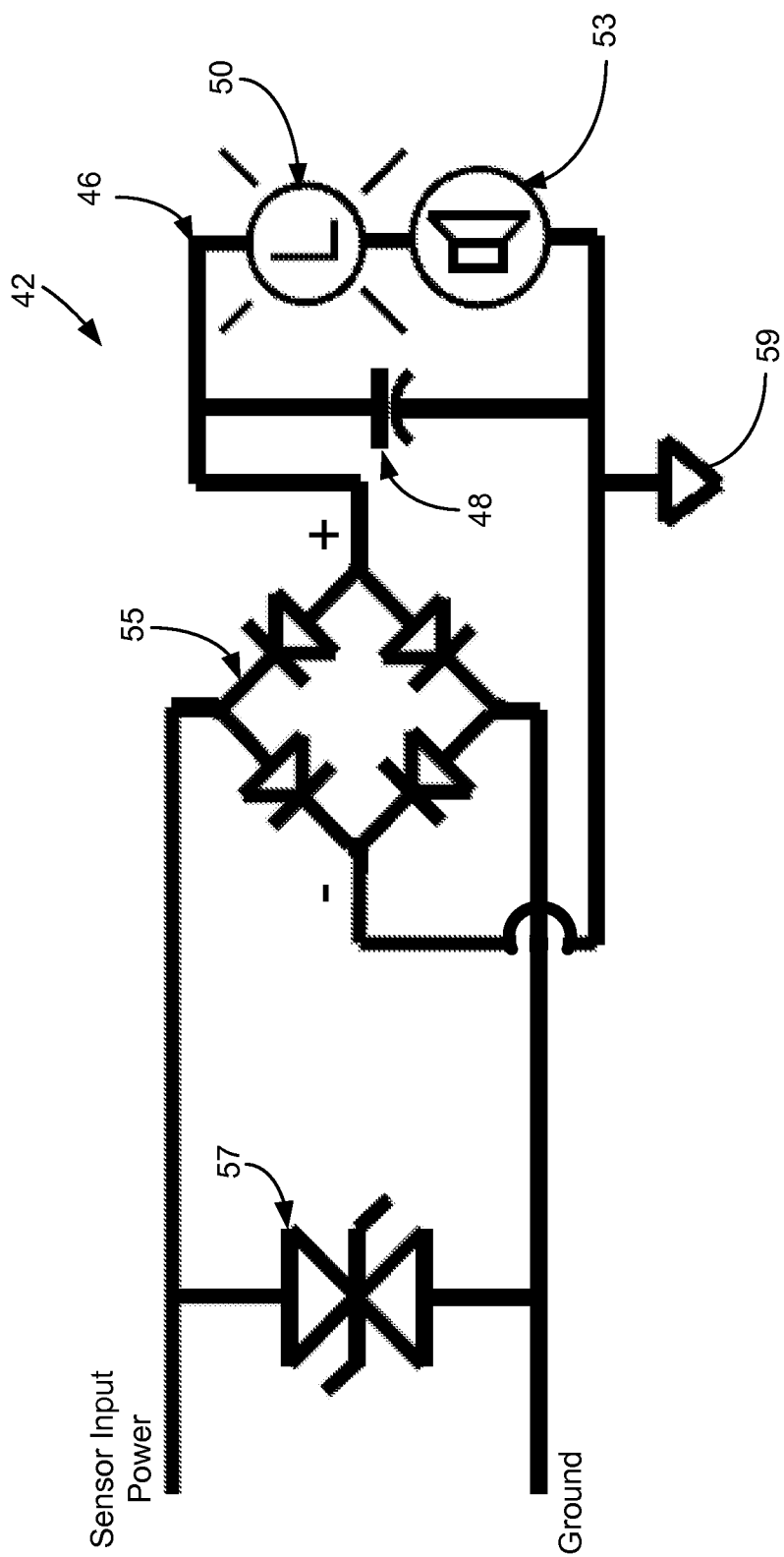
FIG. 2 is a schematic block diagram of a sensing circuit of the electric power system of FIG. 1, according to one embodiment.

Referring to FIG. 2, one embodiment of a sensing circuit 42 is shown schematically as a block diagram. The sensing circuit 42 receives sensor input power from a respective one of the sensors 30 and is electrically-coupled to the grounding conductor 19 of the system 10 or other grounding line. The sensing circuit 42 includes a relaxation oscillator 46. According to the illustrated embodiment, the relaxation oscillator 46 includes a capacitor 48 in parallel with a gas discharge lamp 50. The capacitor 48 has a particular capacitance and the gas discharge lamp 50 has an associated firing or breakdown voltage. Generally, the gas discharge lamp 50 acts as an open circuit until a voltage across the gas discharge lamp reaches the firing voltage at which time the circuit across the lamp closes, the lamp illuminates, and the capacitor begins to discharge through the lamp.

In operation, the capacitor 48 stores electric energy from the sensor input power such that the voltage across the capacitor steadily rises. Once the voltage across the capacitor 48 reaches the firing voltage of the gas discharge lamp 50, the circuit of the gas discharge lamp 50 closes (e.g., the resistance across the lamp drops), and the energy stored in the capacitor is discharged through the lamp resulting in a momentary pulse of current through and illumination of the lamp. Then, once the stored energy discharged from the capacitor 48 drops far enough below the firing voltage of the lamp 50, the circuit of the lamp opens (e.g., the resistance across the lamp rises), and the illumination of the lamp stops. With the circuit of the lamp 50 opened, electric energy from the sensor input power begins again to recharge the capacitor 48. In this manner, the relaxation oscillator 46 causes the gas discharge lamp 50 to cyclically and momentarily illuminate or flash according to a prescribed frequency as sensor input power is received from a sensor 30. Accordingly, a flashing or blinking lamp 50 indicates that a power line being sensed by a sensor 30 is energized. A lamp 50 that is not blinking or flashing indicates the power line is not energized. The frequency of the flashing of the lamp 50 depends at least partially on the capacitance of the capacitor 48, the firing voltage of the lamp 50, and the AC voltage on the conductor wire. Therefore, the capacitance of the capacitor 48, and/or the firing voltage of the lamp 50, can be selected to achieve a desired flash frequency in view of the AC voltage rating of the power cables.

Although the relaxation oscillator 46 of the illustrated embodiment is described as having a gas discharge lamp, which can be a neon lamp, in other embodiments, any of various switching devices can be used, such as threshold devices with hysteresis (e.g., thyratrons, diode for alternating current (DIAC), reverse-biased bipolar transistors, and unijunction transistors). Furthermore, as described above, the gas discharge lamp 50 provides a visual alert of the energy state of the power lines. In some implementations, the sensing circuit 42, including the relaxation oscillator 46, may alternatively, or additionally, include an auditory alert, such as chirping, dinging, and buzzing, to indicate the energy state of the power lines. For example, as shown in FIG. 2, the sensing circuit 42 includes a speaker 53 in series with the gas discharge lamp 50. When the gas discharge lamp 50 is closed (e.g., illuminated), the voltage across the lamp also activates the speaker 53 to produce an audible tone. In yet some embodiments, additional visual alerts may be included in the sensing circuit 42, such as light-emitting diodes (LED) in series with the gas discharge lamp 50.

Referring again to FIG. 2, each sensing circuit 42 may be equipped with a bridge rectifier 55 comprising four or more diodes in a bridge circuit. The bridge rectifier 55 is configured to ensure that the polarity of the output power out of the bridge rectifier is the same regardless of the polarity of the input power into the bridge rectifier. Additionally, each sensing circuit 42 can include a transient voltage suppression device 57, which can include two opposing diodes, such as zener diodes). The transient voltage suppression device 57 is configured to protect the components of the sensing circuit 42 from voltage spikes. Additionally, each sensing circuit 42 may include a ground terminal 59 electrically coupled to ground.

Figure 3:
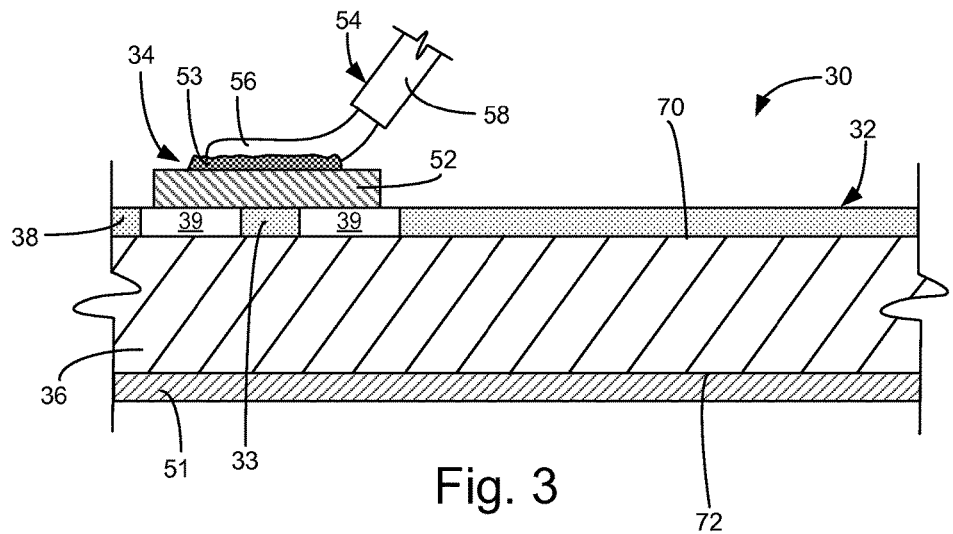
FIG. 3 is a partial cross-sectional side view of an electric power sensor, according to one embodiment.

Now referring to FIG. 3, an electric power sensor 30 according to one embodiment is shown in a partial cross-sectional side view. The sensor 30 includes a sensor pad 32 and an electric terminal 34 coupled to the sensor pad. The sensor pad 32 includes multiple layers (e.g., a flexible substrate 36, an electrically-conductive layer 38, and an adhesive layer 51) permanently or non-removably coupled to each other. In some implementations, the layers are bonded to each other, such as via adhesive bonding, chemical bonding, thermo-compressive bonding, and other bonding techniques. Generally, in certain implementations, the multiple layers are non-removably coupled to each other because the layers cannot be removed from each other without permanently deforming, degrading, or destroying at least one of the layers.

The flexible substrate 36 is a relatively thin sheet with a first surface 70 and an opposing second surface 72. A thickness of the flexible substrate 36 is defined between the first and second surfaces 70, 72. Generally, the flexible substrate 36 has a length (L) and width (W) that are greater than the thickness of the substrate (see, e.g., FIG. 3). In certain implementations, the flexible substrate 36 is a flexible circuit board. The flexible substrate 36 is made from a flexible and electrically non-conductive material. The material of the flexible substrate 36 can be resiliently or non-resiliently flexible. According to some implementations, for example, the material of the flexible substrate 36 is a flexible polymer or polymer-based material, such as flexible plastics. The flexible substrate 36 can be configured to resist crinkling or creasing as it flexes.

The electrically-conductive layer 38 is applied onto the first surface 70 of the flexible substrate 36. As mentioned above, the electrically-conductive layer 38 is permanently or non-removably coupled to the first surface 70 of the flexible substrate 36 in some implementations. The electrically-conductive layer 38 can be permanently applied to the flexible substrate 36 using any of various manufacturing techniques.

Additionally, the electrically-conductive layer 38 can be made from any of various electrically conductive materials. For example, in one implementation, the electrically-conductive layer 38 is made from copper. In other implementations, the electrically-conductive layer 38 can be made from other electrically conductive materials, such as silver, aluminum, nickel, and the like. As shown, the electrically-conductive layer 38 may have a thickness that is less than the thickness of the flexible substrate 36. In one implementation, the electrically-conductive layer 38 is a thin copper foil or plate. Although shown as a single layer, in some implementations, the electrically-conductive layer 38 can be made from two or more interconnected electrically-conductive layers.

Additionally, the material and/or dimensions of the electrically-conductive layer 38 allow the electrically-conductive layer to flex along with the flexible substrate 36. In other words, the electrically-conductive layer 38 flexes as the flexible substrate 36 flexes. Accordingly, the material of the electrically-conductive layer 38 is a relatively malleable or pliable material. Alternatively, or additionally, the thickness of the electrically-conductive layer 38 is relatively thin to facilitate the flexing of the electrically-conductive layer with the flexible substrate 36.

Referring to FIG. 3, the electrically-conductive layer 38 substantially covers the entire first surface 70 of the flexible substrate 36 in some implementations to form a ground plane. In this manner, the area of the electrically-conductive layer 38 relative to the flexible substrate 36 can be maximized. Because the capacitance of a capacitor is dependent upon the area of the opposing plates of the capacitor, increasing the area of the electrically-conductive layer 38 also increases the capacitance of the capacitor created by the sensor 30 and the cable 60.

As shown in FIG. 3, the adhesive layer 51 is applied onto the second surface 72 of the flexible substrate 36. Accordingly, the adhesive layer 51 and electrically-conductive layer 38 are on opposing sides of the flexible substrate 36. Similar to the electrically-conductive layer 38, the adhesive layer 51 is permanently or non-removably coupled to the second surface 72 of the flexible substrate 36 in some implementations. In one implementation, the adhesive layer 51 is permanently coupled to the second surface 72 using an adhesive or via a bonding technique.

The adhesive layer 51 can be made from any of various adhesive materials. For example, in one implementation, the adhesive layer 51 is made from a pressure-sensitive adhesive, such as acrylic adhesives, natural rubber, silicone rubber, styrene block copolymers, vinyl ethers, and the like. The adhesive material of the adhesive layer 51 may comprise the entire thickness of the adhesive layer 51 such that one side of the adhesive material adheres to the second surface 72 of the flexible substrate 36 to secure the adhesive layer 51 to the flexible substrate, and an opposing side of the adhesive material adheres to an outer surface of the cable 60. In addition to being flexible along with the flexible substrate 36, so as to flex as the flexible substrate flexes, the adhesive material may also be resiliently or non-resiliently compressible or deformable. Accordingly, as the adhesive layer 51 is pressed onto the outer surface of the cable 60, the adhesive layer 51 conforms to the surface of the cable by compressing or deforming. In this manner, corona-inducing gaps or voids between the sensor pad 32 and the cable 60 are reduced or eliminated as the sensor pad 32 is wrapped around the cable 60 and pressed against the cable.

Although shown as a single layer, in some implementations, the adhesive layer 51 can be made from two or more interconnected layers. For example, in one implementation, the adhesive layer 51 can include a non-adhesive core layer with first and second adhesive materials applied to opposing sides of the core layer. The first and second adhesive materials can be the same or different. According to certain implementations, the adhesive layer 51 can include a non-adhesive cover or film removably applied to an exterior surface of the adhesive layer. When applied, the non-adhesive cover or film prevents the adhesive layer 51 from adhering to objects, such as for pre-installation processing steps of the sensor 30 (e.g., packaging, shipping, storing, etc.). Then, when the sensor 30 is being installed or coupled to a power cable, the non-adhesive cover or film can be easily removed from the adhesive layer 51 to allow the adhesive layer to be adhered to the power cable.

The electric terminal 34 is coupled to the electrically-conductive layer 38 of the sensor pad 32. Generally, the electric terminal 34 is in electric power receiving communication with the electrically-conductive layer 38 (e.g., a closed electric circuit is formed between the electrically-conductive layer and the electric terminal). Accordingly, electric power is transmittable from the electrically-conductive layer 38 to the electric terminal 34. As shown, the terminal 34 includes a contact pad 52 and a wire 54 coupled to the contact pad.

The contact pad 52 is made from an electrically-conductive material that is permanently bonded to the surface of the electrically-conductive layer 38 to create the electrical connection between the electric terminal 34 and sensor pad 32. Although the solder is not shown, the contact pad 52 can be soldered to the electrically-conductive layer 38 in some implementations. Due to the difficulty of soldering to copper or similar materials, a so-called thermal pad can be created to improve solderability at the soldering site by reducing heat transfer away from the soldering site. Generally, the thermal pad includes removed portions 39 of the electrically-conductive layer 38 to create smaller contact areas 33 or tracks of the electrically-conductive layer to which the contact pad 52 is soldered.

The wire 54 is soldered to the contact pad 52 via solder 53. More specifically, a conductor 56 of the wire 54 is soldered to the contact pad 52. The conductor 56 is surrounded by an electrically non-conductive sleeve 58. Accordingly, electric power is transmittable from the electrically-conductive layer 38 to the conductor 56 of the wire 54 via the contact pad 52. In some implementations, the terminal 34, including the contact pad 52 and wire 54, is pre-coupled to the sensor pad 32 before installing the sensor pad 32 about the power cable. For example, the terminal 34 can be bonded to the sensor pad 32 during a manufacturing phase at a manufacturer before being shipped to and used by end-users. In this manner, the end-user need not perform the step of electrically coupling a terminal to a sensor pad.

As shown in FIGS. 4-8, the sensor 30 is coupled to the power cable 60. According to one embodiment, coupling the sensor 30 to the power cable 60 includes wrapping the sensor pad 32 at least partially about an exterior surface of the power cable 60 and adhering the sensor pad to the exterior surface by pressing the adhesive layer of the sensor pad against the exterior surface. In some implementations, a length L of the sensor pad 32 is such that the sensor pad is at least partially wrapped about and adhered to itself as shown in FIG. 4. However, in other implementations, the length L of the sensor pad 32 is such that the sensor pad does not wrap about an entire outer circumference of the power cable 60. Accordingly, one sensor 30 is configured to fit power cables having any of various sizes. Whether wrapped completely or partially about the power cable 60, the sensor pad 32 forms a generally hollow tube.

Figure 5:
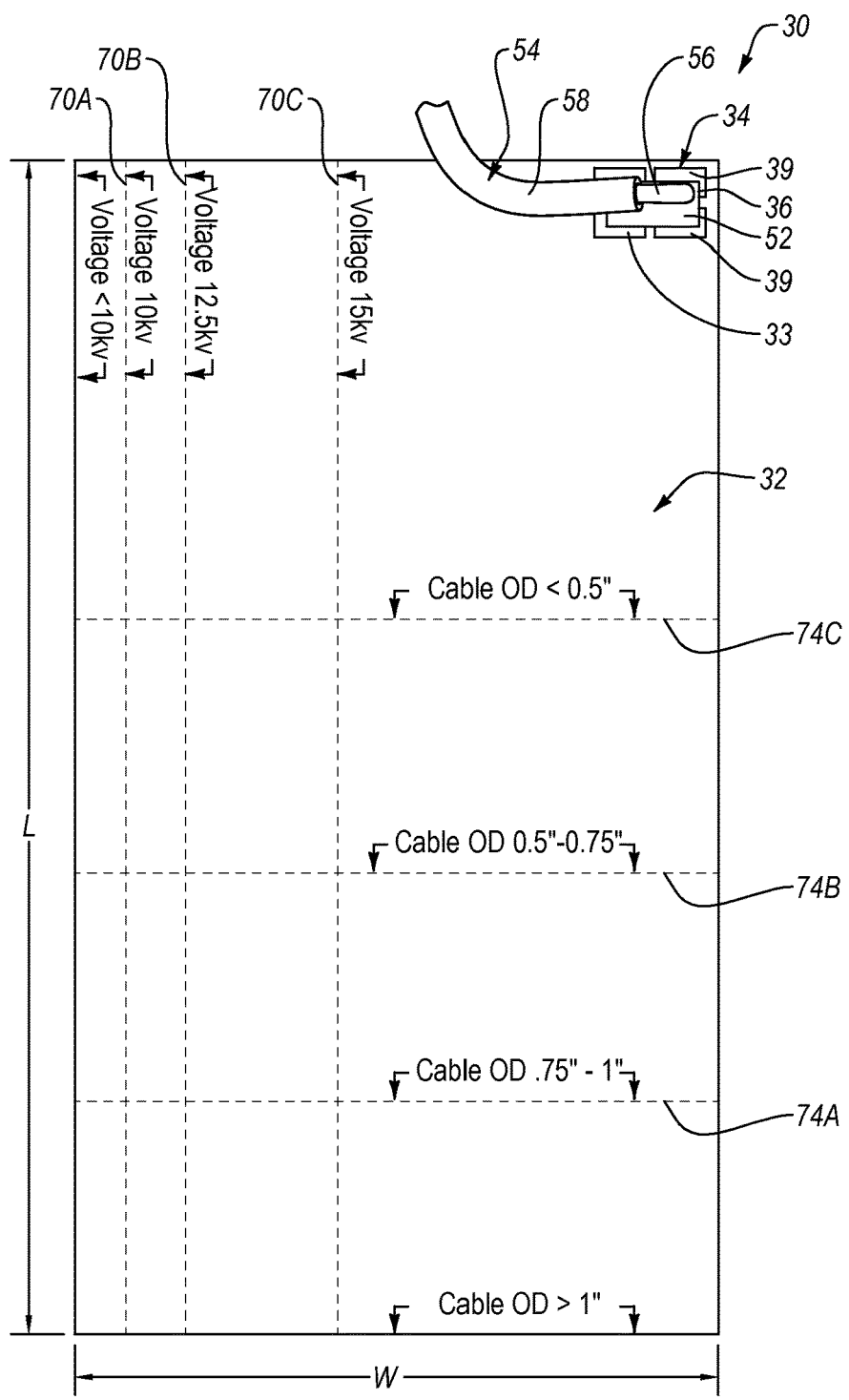
FIG. 5 is a top plan view of an electric power sensor, according to one embodiment.
Figure 6:
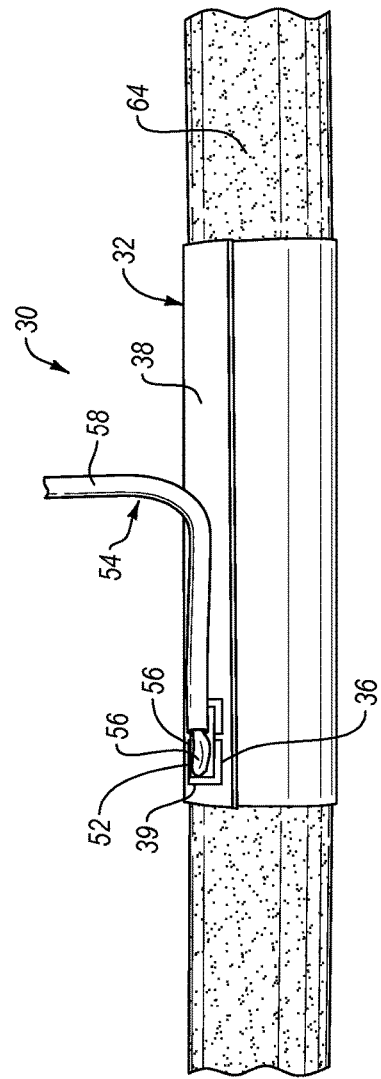
FIG. 6 is a side view of an electric power system with an electric power sensor, according to one embodiment.

Referring to FIG. 5, the terminal 34 is positioned proximate a first end of the sensor pad 32 with the sensor pad have an opposing second end. The wrapping of the sensor pad 32 about the power cable 60 is initiated at the second end, such that the first end is not overlapped by the sensor pad. In this manner, as shown in FIG. 6, the terminal 34 remains exposed after the sensor pad 32 is wrapped about the power cable 60. The wire 54 of the terminal 34 can be bent or angled such that the portion of the wire extending from sensor pad 32 and cable 60 is substantially angled (e.g., transverse) relative to the cable as shown in FIG. 6.

Figure 7:
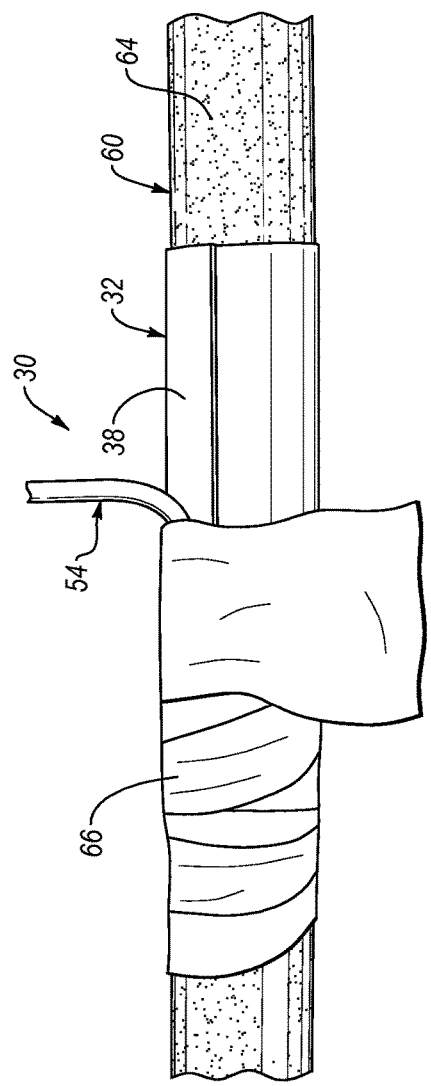
FIG. 7 is a side view of an electric power system with an electric power sensor partially wrapped by tape, according to one embodiment.
Figure 8:
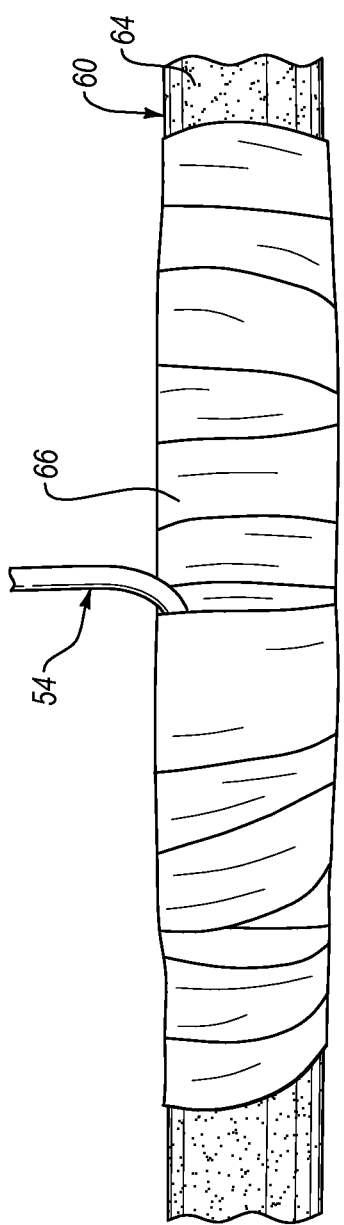
FIG. 8 is a side view of an electric power system with an electric power sensor completely wrapped by tape, according to one embodiment.

Once the sensor pad 32 is properly wrapped about and adhered to the cable 60, as shown in FIG. 7, an electrically non-conductive tape 66 is wrapped about the sensor pad and cable to electrically isolate or insulate the sensor pad. The tape 66 is wrapped so as allow the portion of the wire 54 extending from the sensor pad 32 and cable 60 to remain extended from the sensor pad and cable following the wrapping as shown in FIG. 8.

The capacitance of the capacitor created by the sensor 30 and the power cable 60 is dependent upon the area of the electrically-conductive layer 38, which is dependent on the dimensions of the electrically-conductive layer, as well as the diameter of the power cable. Furthermore, the power output characteristics of the sensor 30 is dependent on the voltage rating of the power cable 60 (e.g., the voltage level of electric power flowing through the cable) and the capacitance of the capacitor created by the sensor and power cable. Because the voltage rating of the power cable 60 is normally preset and not adjustable, to predictably control the power output characteristics of the sensor 30, the area of the electrically-conductive layer 38 can be adjusted based on the voltage rating of the power cable.

According to one embodiment, the materials of the sensor pad 32 are easily cut by a cutting device, such as scissors. Therefore, the area of the sensor pad 32, and thus the area of the electrically-conductive layer 38, can be reduced by cutting away a portion or portions of the sensor pad. Generally, the sensor pad 32 can be easily cut on indicia, as described below, to optimize the performance of the sensor 30 to a particular cable size and voltage rating.

To facilitate the adjustment of the area of the sensor pad 32 to a desired area corresponding to the voltage rating of the power cable 60, various indicia 70A-C can be added to the sensor pad 32 to indicate to an end-user where to cut the sensor pad 32 in order to achieve the desired area by reducing a width W of the pad. In one implementation, the indicia 70A-C is printed onto the electrically-conductive layer 38, and in other implementations, the indicia is etched into the electrically-conductive layer. Alternatively, in certain implementations, the indicia can be printed onto or etched into the adhesive layer 51. Each indicium 70A-C represents a cut line associated with a respective one of a plurality of voltage ratings. Generally, the first indicium 70A is associated with a first voltage rating, the second indicium 70B is associated with a second voltage rating, and the third indicium 70C is associated with a third voltage rating. The width-wise spacing between the indicia 70A-C may be the same or different. For example, the space between the indicium 70B and indicium 70C is larger than the space between the indicium 70B and indicium 70A. A fourth voltage rating associated with an uncut or original width W of the sensor pad 32 may also be indicated as shown. In general, the higher the voltage rating of the cable 60, the smaller the desired area of the electrically-conductive layer 38. The voltage ratings indicated by the indicium are associated with voltages intended to be detected by the electric power sensor.

Additional indicia can include indicium, such as indicium 74A-C, identifying cut lines for adjusting a length L of the sensor pad 32. To avoid excessing overlapping of the sensor pad 32 about the power cable 60, the length L of the sensor pad 32 can be adjusted according to the diametric size of the power cable. Therefore, each indicium 74A-C can be associated with a particular size of a plurality of sizes of a power cable as indicated. Also, another diametric size of a power cable associated with an uncut or original width L of the sensor pad 32 may also be indicated as shown.

In some embodiments, all or some of the features of the electric power system 10 can be arranged or packaged as a kit to be at least partially assembled by an end-user. In one implementation, an electric sensor kit includes one or more sensors 30 (with the sensor pad 32 and terminal 34 pre-coupled together) and a monitor module 40. According to another implementation, just the sensors 30 are joined together to form a kit. The tape 66 for wrapping around the sensors 30 can form part of a kit as well.

Figure 9:
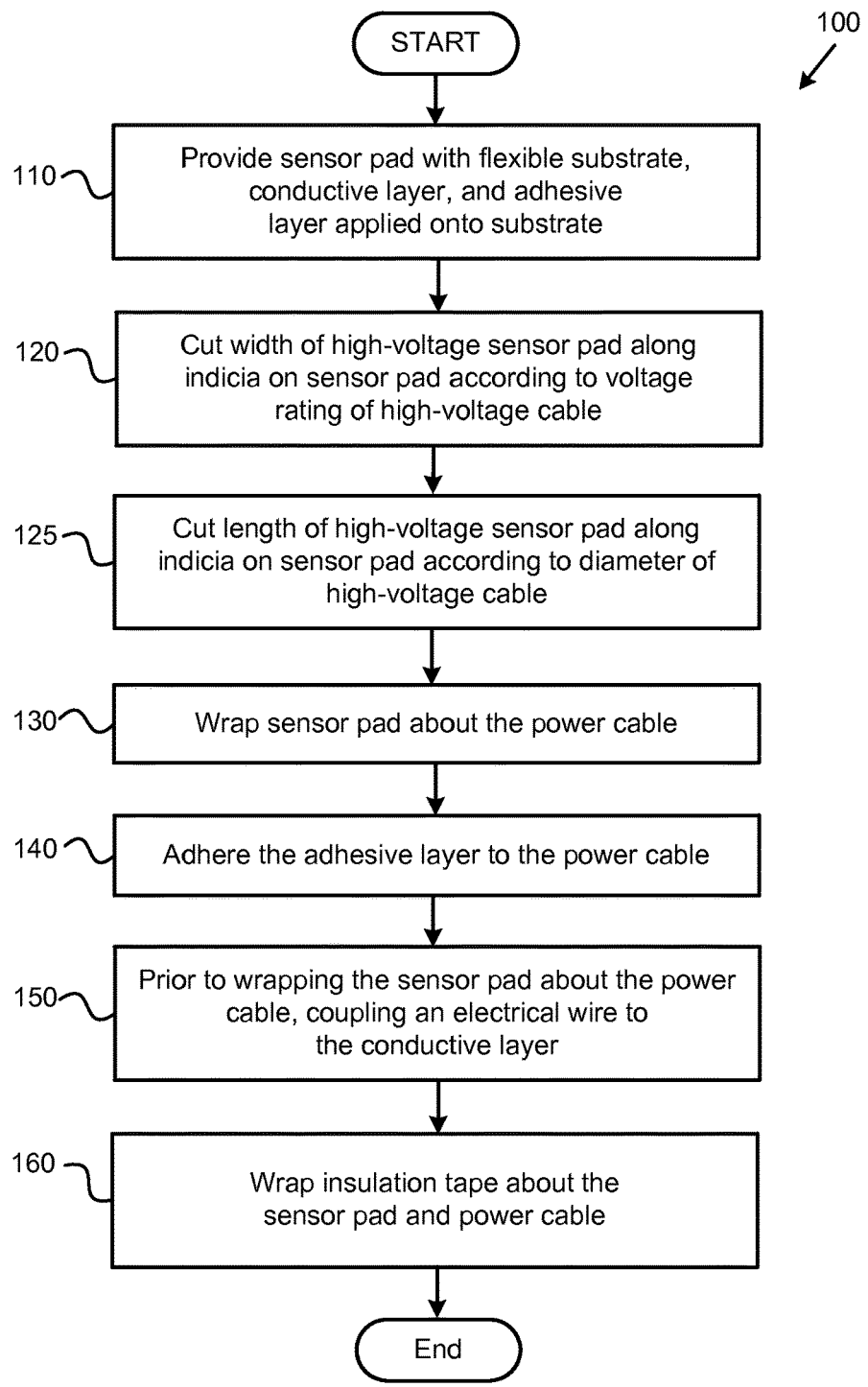
FIG. 9 is a schematic flow chart of a method of sensing electric energy in an electric power cable, according to one embodiment.

Referring to FIG. 9, according to one embodiment, a method 100 of sensing electric energy in a power cable is shown schematically in a flow chart diagram. The method 100 includes providing a sensor pad with a flexible substrate, an electrically-conductive layer, and an adhesive layer (e.g., sensor pad 32) at 110. Also, the method 100 includes cutting a width of the high-voltage sensor pad along indicia on the sensor pad according to the voltage rating of the power cable at 120. Further, in some implementations, the method 100 includes cutting a length of the high-voltage sensor pad along indicia on the sensor pad according to a diameter of the high-voltage cable at 125. In this manner, a single sensor pad can be modified to optimize the performance of the sensor pad based on the configuration of the power cable to be sensed. The method 100 additionally includes wrapping the sensor pad about the power cable at 130 and adhering the adhesive layer to the power cable at 140. Further, the method 100 includes coupling an electrical wire (e.g., terminal 34) to the conductive layer at 140, prior to wrapping the sensor pad about the power cable at 130. The method 100 includes wrapping insulation tape about the sensor pad and power cable at 160 after the sensor pad is wrapped about the power cable at 130.

In the above description, certain terms may be used such as "up," "down," "upper," "lower," "horizontal," "vertical," "left," "right," and the like. These terms are used, where applicable, to provide some clarity of description when dealing with relative relationships. But, these terms are not intended to imply absolute relationships, positions, and/or orientations. For example, with respect to an object, an "upper" surface can become a "lower" surface simply by turning the object over. Nevertheless, it is still the same object. Further, the terms "including," "comprising," "having," and variations thereof mean "including but not limited to" unless expressly specified otherwise. An enumerated listing of items does not imply that any or all of the items are mutually exclusive and/or mutually inclusive, unless expressly specified otherwise. The terms "a," "an," and "the" also refer to "one or more" unless expressly specified otherwise.

Unless otherwise indicated, the terms "first," "second," etc. are used herein merely as labels, and are not intended to impose ordinal, positional, or hierarchical requirements on the items to which these terms refer. Moreover, reference to, e.g., a "second" item does not require or preclude the existence of, e.g., a "first" or lower-numbered item, and/or, e.g., a "third" or higher-numbered item.

Additionally, instances in this specification where one element is "coupled" to another element can include direct and indirect coupling. Direct coupling can be defined as one element coupled to and in some contact with another element. Indirect coupling can be defined as coupling between two elements not in direct contact with each other, but having one or more additional elements between the coupled elements. Further, as used herein, securing one element to another element can include direct securing and indirect securing. Additionally, as used herein, "adjacent" does not necessarily denote contact. For example, one element can be adjacent another element without being in contact with that element.

As used herein, the phrase "at least one of", when used with a list of items, means different combinations of one or more of the listed items may be used and only one of the items in the list may be needed. The item may be a particular object, thing, or category. In other words, "at least one of" means any combination of items or number of items may be used from the list, but not all of the items in the list may be required. For example, "at least one of item A, item B, and item C" may mean item A; item A and item B; item B; item A, item B, and item C; or item B and item C. In some cases, "at least one of item A, item B, and item C" may mean, for example, without limitation, two of item A, one of item B, and ten of item C; four of item B and seven of item C; or some other suitable combination.

The schematic flow chart diagrams included herein are generally set forth as logical flow chart diagrams. As such, the depicted order and labeled steps are indicative of one embodiment of the presented method. Other steps and methods may be conceived that are equivalent in function, logic, or effect to one or more steps, or portions thereof, of the illustrated method. Additionally, the format and symbols employed are provided to explain the logical steps of the method and are understood not to limit the scope of the method. Although various arrow types and line types may be employed in the flow chart diagrams, they are understood not to limit the scope of the corresponding method. Indeed, some arrows or other connectors may be used to indicate only the logical flow of the method. For instance, an arrow may indicate a waiting or monitoring period of unspecified duration between enumerated steps of the depicted method. Additionally, the order in which a particular method occurs may or may not strictly adhere to the order of the corresponding steps shown.

The present subject matter may be embodied in other specific forms without departing from its spirit or essential characteristics. The described embodiments are to be considered in all respects only as illustrative and not restrictive. The scope of the invention is, therefore, indicated by the appended claims rather than by the foregoing description. All changes which come within the meaning and range of equivalency of the claims are to be embraced within their scope.

What is claimed is:

1. An electric power sensor, comprising:
   a sensor pad comprising:
      a flexible substrate defining a first surface and a second surface opposing the first surface, wherein the flexible substrate is made of an electrically non-conductive material;
      an electrically-conductive layer applied directly onto the first surface of the flexible substrate, wherein the electrically-conductive layer comprises a ground plane covering a substantial portion of the flexible substrate and wherein an entirety of the electrically-conductive layer forms a single electrical path; and
      an adhesive layer applied directly onto the second surface of the flexible substrate, such that the flexible substrate is immediately between the electrically-conductive layer and the adhesive layer;
   an electric terminal electrically coupled to the electrically-conductive layer of the sensor pad;
   a plurality of parallel first line indicia spaced apart from each other on the electrically-conductive layer or the adhesive layer, each of the plurality of parallel first line indicia comprising ink or a cut;
   a plurality of voltage rating indicia on the electrically-conductive layer or the adhesive layer, wherein the plurality of voltage rating indicia are different from one another, and wherein each of the plurality of voltage rating indicia comprises ink or a cut and is graphically tied to a respective one of the plurality of parallel first line indicia;
   a plurality of parallel second line indicia spaced apart from each other on the electrically-conductive layer or the adhesive layer, each of the plurality of parallel second line indicia comprising ink or a cut, wherein the plurality of parallel second line indicia are perpendicular to the plurality of parallel first line indicia; and
   a plurality of power cable size indicia on the electrically-conductive layer or the adhesive layer, wherein the plurality of power cable size indicia are different from one another, and wherein each of the plurality of power cable size indicia comprises ink or a cut and is graphically tied to a respective one of the plurality of parallel second line indicia.

2. The electric power sensor of claim 1, wherein the electric terminal is soldered to the electrically-conductive layer.

3. The electric power sensor of claim 1, wherein the flexible substrate comprises a flexible printed circuit board.

4. The electric power sensor of claim 1, wherein the flexible substrate is made from a polymer.

5. The electric power sensor of claim 1, wherein the sensor pad forms a hollow tube.

6. The electric power sensor of claim 1, further comprising a relaxation oscillator electrically coupled to the electric terminal.

7. The electric power sensor of claim 6, wherein the relaxation oscillator comprises a capacitor in parallel with a gas discharge lamp.

8. The electric power sensor of claim 7, wherein the relaxation oscillator further comprises at least one light-emitting device in series with the gas discharge lamp.

9. The electric power sensor of claim 7, wherein the relaxation oscillator further comprises at least one audible transducer in series with the gas discharge lamp.

10. The electric power sensor of claim 1, wherein the electric terminal is non-removably coupled to the electrically-conductive layer such that the electric terminal cannot be removed from the electrically-conductive layer without permanently deforming, degrading, or destroying at least one of the electric terminal or the electrically-conductive layer.

11. The electric power sensor of claim 1, wherein the electrically-conductive layer is non-removably fixed to the first surface of the flexible substrate, and the adhesive layer is non-removably fixed to the second surface of the flexible substrate, such that:

the electrically-conductive layer cannot be removed from the first surface of the flexible substrate without permanently deforming, degrading, or destroying at least one of the electrically-conductive layer or the first surface of the flexible substrate; and the adhesive layer cannot be removed from the second surface of the flexible substrate without permanently deforming, degrading, or destroying at least one of the adhesive layer or the second surface of the flexible substrate.

12. An electric power system, comprising:
an electric power sensor, comprising:
    a sensor pad comprising:
        a flexible substrate defining a first surface and a second surface opposing the first surface, wherein the flexible substrate is made of an electrically non-conductive material;
        an electrically-conductive layer applied directly onto the first surface of the flexible substrate, wherein the electrically-conductive layer comprises a ground plane covering a substantial portion of the flexible substrate and wherein an entirety of the electrically-conductive layer forms a single electrical path; and
        an adhesive layer applied directly onto the second surface of the flexible substrate, such that the flexible substrate is immediately between the electrically-conductive layer and the adhesive layer; and
    an electric terminal electrically coupled to the electrically-conductive layer of the sensor pad;
    a power cable comprising an electrically-conductive wire surrounded by an electrically-insulating sleeve, the sensor pad being wrapped about the power cable, wherein the adhesive layer is adhered to the electrically-insulating sleeve;
    a plurality of parallel first line indicia spaced apart from each other on the electrically-conductive layer or the adhesive layer, each of the plurality of parallel first line indicia comprising ink or a cut;
    a plurality of voltage rating indicia on the electrically-conductive layer or the adhesive layer, wherein the plurality of voltage rating indicia are different from one another, and wherein each of the plurality of voltage rating indicia comprises ink or a cut and is graphically tied to a respective one of the plurality of parallel first line indicia;
    a plurality of parallel second line indicia spaced apart from each other on the electrically-conductive layer or the adhesive layer, each of the plurality of parallel second line indicia comprising ink or a cut, wherein the plurality of parallel second line indicia are perpendicular to the plurality of parallel first line indicia; and
    a plurality of power cable size indicia on the electrically-conductive layer or the adhesive layer, wherein the plurality of power cable size indicia are different from one another, and wherein each of the plurality of power cable size indicia comprises ink or a cut and is graphically tied to a respective one of the plurality of parallel second line indicia.

13. The electric power system of claim 12, further comprising a capacitor, wherein the electrically-conductive wire forms a first plate of the capacitor, the electrically-conductive layer forms a second plate of the capacitor, and the electrically-insulating sleeve forms at least part of a dielectric of the capacitor.

14. The electric power system of claim 12, further comprising electrically non-conductive tape wrapped about the sensor pad and power cable.

15. The electric power system of claim 12, wherein the sensor pad overlaps itself around the power cable.

* * * * *